United States Patent
Wang et al.

(10) Patent No.: US 8,785,905 B1
(45) Date of Patent: Jul. 22, 2014

(54) AMBER LIGHT-EMITTING DIODE COMPRISING A GROUP III-NITRIDE NANOWIRE ACTIVE REGION

(71) Applicant: Sandia Corporation, Albuquerque, NM (US)

(72) Inventors: George T. Wang, Albuquerque, NM (US); Qiming Li, Albuquerque, NM (US); Jonathan J. Wierer, Jr., Albuquerque, NM (US); Daniel Koleske, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 13/743,438

(22) Filed: Jan. 17, 2013

Related U.S. Application Data (60) Provisional application No. 61/588,446, filed on Jan. 19, 2012.

(51) Int. Cl.
*H01L 29/06* (2006.01)
*H01L 29/15* (2006.01)
*H01L 33/04* (2010.01)
*B82Y 40/00* (2011.01)

(52) U.S. Cl.
CPC ............ *H01L 33/04* (2013.01); *B82Y 40/00* (2013.01); *Y10S 977/762* (2013.01)
USPC ............... 257/13; 257/88; 257/615; 977/762

(58) Field of Classification Search
CPC ......... H01L 33/00; H01L 33/30; H01L 33/20; H01L 33/24; H01L 2924/12041; H01L 21/02603; H01L 21/0237

USPC ................... 257/88, 615, E31, E21, E33.072, 257/E33.066, 13; 438/41, 44, 39
See application file for complete search history.

(56) References Cited

U.S. PATENT DOCUMENTS

| | | | |
|---|---|---|---|
| 8,350,249 B1* | 1/2013 | Svensson | 257/9 |
| 2006/0223211 A1* | 10/2006 | Mishra et al. | 438/41 |
| 2008/0036038 A1* | 2/2008 | Hersee et al. | 257/615 |
| 2010/0163840 A1* | 7/2010 | Seifert et al. | 257/13 |
| 2011/0240959 A1* | 10/2011 | Konsek et al. | 257/13 |
| 2011/0309382 A1* | 12/2011 | Lowgren | 257/88 |

OTHER PUBLICATIONS

Kuykendall, Tevye et al., "Complete composition tunability of InGaN nanowires using a combinatorial approach", Nature Materials, Dec. 2007, pp. 951-956, vol. 6.

Li, Qiming et al., "Strain influenced indium composition distribution in GaN/InGaN core-shell nanowires", Applied Physics Letters, 2010, pp. 181107-1-181107-3, vol. 97.

(Continued)

*Primary Examiner* — Matthew Reames
*Assistant Examiner* — Vincent Wall
(74) *Attorney, Agent, or Firm* — Kevin W. Bieg (57) ABSTRACT

A temperature stable (color and efficiency) III-nitride based amber (585 nm) light-emitting diode is based on a novel hybrid nanowire-planar structure. The arrays of GaN nanowires enable radial InGaN/GaN quantum well LED structures with high indium content and high material quality. The high efficiency and temperature stable direct yellow and red phosphor-free emitters enable high efficiency white LEDs based on the RGYB color-mixing approach.

17 Claims, 6 Drawing Sheets

(56) References Cited

OTHER PUBLICATIONS

Cho, Chu-Young et al., "High-efficiency light-emitting diode with air voids embedded in lateral epitaxially overgrown GaN using metal mask", Optics Express, Jul. 2011, pp. A943-A948, vol. 19, No. S4.

Lai, Wei-Chih et al., "GaN-based light emitting diodes with embedded SiO2 pillars and air gap array structures", Applied Physics Letters, 2010, pp. 081103-1-81103-3, vol. 97.

Kim, Hyung Gu. et al., "Impact of two-floor air prism arrays as an embedded reflector for enhancing the output power of InGaN/GaN light emitting diodes", Applied Physics Letters, 2009, pp. 221110-1-221110-3, vol. 95.

Li, Qiming et al., "Dislocation density reduction in GaN by dislocation filtering through a sef-assembled monolayer of silica microspheres". Applied Physics Letters, 2009, pp. 231105-1-231105-3, vol. 94.

* cited by examiner

AMBER LIGHT-EMITTING DIODE COMPRISING A GROUP III-NITRIDE NANOWIRE ACTIVE REGION

CROSS-REFERENCE TO RELATED APPLICATIONS

This application claims the benefit of U.S. Provisional Application No. 61/588,446, filed Jan. 19, 2012, which is incorporated herein by reference. This application is related to U.S. application Ser. No. 13/434,646, filed Mar. 29, 2012, and SD11787.1, "Method of Fabricating Vertically Aligned Group III-V Nanowires," filed of even date with this application, both of which are incorporated herein by reference.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to light-emitting diodes and, in particular, to a temperature stable amber light-emitting diode (LED) that employs a Group III-Nitride nanowire active region.

BACKGROUND OF THE INVENTION

Two common approaches currently exist for producing white lighting from LEDs-phosphor-conversion LEDs (pc-LEDs) and discrete color mixing LEDs. In pc-LEDs, a portion of the light emitted from a blue LED chip is down-converted by a phosphor and the longer wavelengths add to the blue to produce white light. In current schemes, blue light (~460 nm) from an InGaN/GaN-based LED is typically used in combination with a single green-yellow phosphor to produce white light. Although additional phosphors can be added to broaden the emitted spectrum and improve the Color Rendering Index (CRI) and reach warmer color temperatures, it is at a cost to device efficacy. While pc-LEDs currently represent the most popular approach for high intensity white LEDs, they suffer from certain disadvantages, most notably Stokes losses, which are an unavoidable consequence of the energy down-conversion process and result in decreases in LED efficiency. While improvements in phosphor efficiencies continue to be made, significant Stokes losses are inevitable.

Thus, discrete color-mixing LEDs, which incorporate direct-emitting RGB or RYGB elements to create white light, are likely to ultimately offer the best route for highest efficacy white LEDs. However, while high efficiency LEDs exist in the blue wavelengths, realization of high efficiency discrete color mixed RYGB LEDs is seriously hindered by a lack of efficient and temperature stable LEDs in the yellow-red wavelengths (and to a lesser extent in the green). This long wavelength gap is a consequence of the difficulties in forming high quality InGaN films with the higher indium concentrations needed to achieve the longer wavelengths (lower bandgaps) due to lattice mismatch strain effects with GaN. Red LEDs based on the AlInGaP materials system, while efficient at longer red wavelengths, are much less efficient at the shorter red (615 nm) and amber (580-590 nm) wavelengths needed for high efficiency and high CRI color-mixed white LEDs due to limitations in that material system. See M. R. Krames et al., *J. Display Technology* 3, 160 (2007); and J. M. Phillips et al., *Laser & Photonics Reviews* 1, 307 (2007). The limitations of poor carrier confinement and carrier losses to indirect parts to the AlInGaP bandstructure are fundamental, and most likely impossible to overcome. Moreover, these limitations of red and yellow AlInGaP LEDs also lead to poor temperature stability and additional efficiency losses and color shifts at operating temperatures typical of high brightness LEDs (e.g. 125° C.).

While currently competitive, pc-LEDs are unable to meet the targets of 81% EQE for green, red, and amber LEDs, which will likely require more efficient direct-emitting LEDs. Current direct-emitting red and amber LEDs based on the AlInGaP materials system suffer from significant efficiency losses and color shifts at the higher operating temperatures typical of high brightness LEDs. Therefore, a need remains for efficient red (610-620 nm) or amber (580-595 nm) LEDs which allow for optimization of spectral efficiency with high color quality over a range of Correlated Color Temperature (CCT) and which also exhibit color and efficiency stability with respect to operating temperature. The present invention is directed to high efficiency amber LEDs which exhibit color and efficiency stability with respect to operating temperature. Amber wavelengths can also provide a path forward for III-nitride based red (615 nm) LEDs based on this invention. This invention therefore enables high efficiency and temperature stable direct emitting LEDs in the amber and red wavelengths necessary for creating high efficiency white light emitters based on color-mixed LEDs.

SUMMARY OF THE INVENTION

The current invention is directed to a light-emitting diode, comprising an n-type base; a core-shell structure on the n-type base, comprising an array of vertically aligned n-type nanowire cores, each core surrounded by a radially grown Group III-nitride multiple quantum well shell layer to provide a core-shell nanowire; a p-type canopy layer grown on all facets of the core-shell nanowires that is coalesced at the top, thereby providing a continuous film that electrically connects the tops and sides of all the nanowires; and a p-contact to the p-type canopy layer and an n-contact to the n-type base for applying a voltage across the core-shell structure and extracting electroluminescent emitted light therefrom. Typically, the nanowire cores can be less than 10 microns in height and less than 1 micron in diameter. The n-type nanowire cores can comprise n-type GaN, the shell layer comprises an InGaN/GaN multiple quantum well, and the p-type canopy layer comprises p-type InGaN or p-type GaN with an indium concentration of the InGaN layers of the multiple quantum well greater than 20%. The emitted light can have a wavelength of between about 550 nm and 620 nm. The n-type base can be grown on the frontside of a substrate that is transparent to the emitted light, such as sapphire. A reflective layer, such as aluminum or Ti/Al, can be deposited on the backside of the substrate. Alternatively, the n-type base can be grown on another suitable substrate, such as silicon, GaN, SiC, or AlN. A spreading metal contact layer (e.g., NiAu or Ag) or a transparent conductive oxide layer (e.g., indium-tin-oxide) can be deposited on the p-type canopy layer to overcome the resistance and poor current spreading of the p-type layers. Alternatively, an inverted structure can comprise an array of vertically aligned p-type GaN nanowire cores surrounded by a Group III-nitride MQW shell layer and an n-type GaN canopy layer. Other Group III-nitride and core-shell structures can also be used.

The invention provides a temperature stable (color and efficiency) III-nitride based amber light-emitting diode based on a novel hybrid nanowire-planar structure. The arrays of GaN nanowires enable radial InGaN/GaN quantum well LED structures with high indium content and high material quality. Due to facile strain accommodation in nanowires, much greater indium concentrations are achievable in InGaN material in comparison to planar films, where high strain limits indium incorporation and degrades material quality and efficiencies in the green to red wavelengths (hence the current "green-yellow-red gap"). Direct emitting (phosphor-free) amber LEDs (targeted wavelength ~585 nm) can have higher quantum efficiencies (IQE @ 35A/cm$^2$≥2.24%, EQE @ 35A/cm$^2$≥12%, ~585 nm) and significantly higher temperature stability (relative thermal stability (100° C. vs. 25° C.) of 60%) than that of current state-of-the-art amber LEDs based on the AlInGaP materials system. This enables high efficiency and temperature stable direct yellow, orange, and potentially red phosphor-free emitters needed for high efficiency white LEDs based on the RGYB color-mixing approach.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

DETAILED DESCRIPTION OF THE INVENTION

According to the present invention, amber LEDs (~585 nm) with high efficiencies and high temperature stability based on the InGaN materials system can be fabricated by employing a novel three-dimensional, hybrid core-shell device structure. In this structure, the active emitter MQW regions are grown on a high quality nanowire template, while a top coalesced p-type (In)GaN layer enables standard planar device processing. The nanowire architecture allows for growth of higher indium content InGaN layers than is possible in standard planar InGaN/GaN film heterostructures, due to the unique ability of nanowires to accommodate lattice mismatch strain owing to their large free surface area and nanoscale dimensions. See T. Kuykendall et al., *Nature Mater.* 6, 951 (2007); and Q. M. Li and G. T. Wang, *Appl. Phys. Lett.* 97, 181107 (2010). While indium concentrations greater than ~20% in planar InGaN on GaN material lead to a significant degradation in the material and hence optical quality, InGaN layers on nanowires have been demonstrated with indium concentrations of ~40% and good material quality. See Q. M. Li and G. T. Wang, *Appl. Phys. Lett.* 97, 181107 (2010). The high quality, high indium content InGaN layers enable long wavelength (yellow to red) direct emitting LEDs based on the InGaN materials system with greater thermal stability than LEDs based on the AlInGaP system, which suffers from significant efficiency losses and color shifts at the higher operating temperatures typical of high brightness LEDs. See J. M. Phillips et al., *Laser & Photonics Reviews* 1, 307 (2007). For example, direct emitting (phosphor-free) amber LEDs (targeted wavelength ~585 nm) can have higher quantum efficiencies (IQE @35A/cm$^2$≥24%, EQE @35A/cm$^2$≥2%, ~585 nm) and significantly higher temperature stability (relative thermal stability at 100° C. vs. 25° C. of 60%) than that of current state-of-the-art amber LEDs based on the AlInGaP materials system. Being nonpolar devices, issues such as wavelength shifting as a function of current density can also be alleviated, and droop can be mitigated through the use of thicker quantum wells on the nonpolar nanowire facets. See J. S. Speck and S. F. Chichibu, *MRS Bulletin* 34, 304 (2009). The InGaN/GaN MQWs can be grown on nonpolar crystal planes of the nanowire sidewalls, eliminating the polarization-induced fields present in planar c-plane LEDs which can reduce radiative recombination efficiencies and cause a blue shift in the emission wavelengths as the drive current is increased. The extraction efficiencies of the device can also be naturally high due to the embedded air-void structure and faceted top surface. See C. Y. Cho et al., *Opt. Express* 19, A943 (2011); W. C. Lai et al., *Appl. Phys. Lett.* 97, (2010); and K. Hyung Gu et al., *Appl. Phys. Lett.* 95, 221110 (2009). The 3D vertical integration of the MQW regions also enables a potential increase in the effective device densities which can increase the brightness per unit of chip area, benefitting cost and package integration issues.

Figures 1A, 1B:
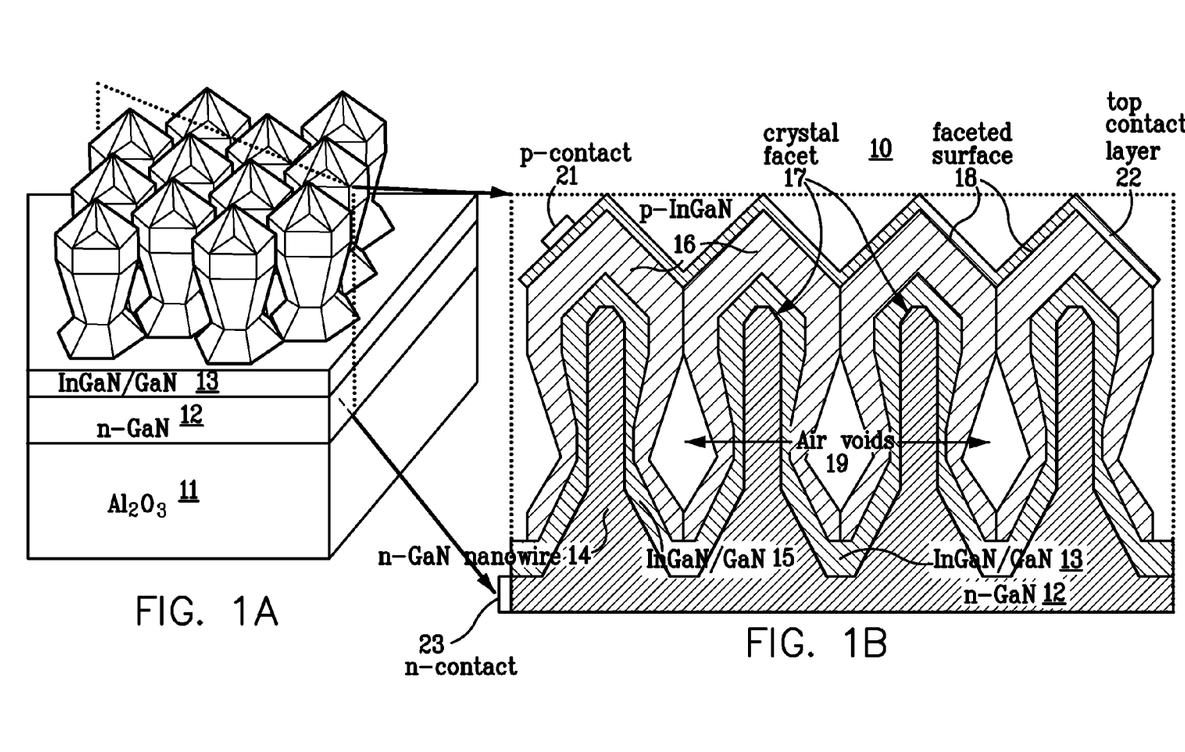
FIG. 1(a) is a perspective view schematic illustration and FIG. 1(b) is cross-sectional side view schematic illustration of four nanowires of an exemplary hybrid core-shell nanowire structure.

A schematic illustration of the hybrid core-shell structure 10 of an exemplary embodiment of the present invention is shown in FIG. 1. In this exemplary LED device, the InGaN/GaN MQW shell layer 15 is grown radially around a semi-ordered array of vertically-aligned n-type GaN nanowires 14 connected to a base n-type GaN layer 12. Subsequently, a p-type (In)GaN layer 16 is grown to form a continuous coalesced layer connecting the nanowires and completing the LED structure. A key strength of the resulting hybrid nanowire-film architecture is that it allows for standard planar device processing to the n-type and p-type layers, solving a key and common problem with nanowire-based devices, while simultaneously enabling the advantages provided by the nanowire-based active regions, such as high In-content InGaN layers and nonpolar orientation growth. All growths can be done using metal organic chemical vapor deposition (MOCVD), which is the standard technique used in the LED industry, thus facilitating commercial adoption. The details of an exemplary device fabrication and structure are described below.

The hybrid nanowire-film structure shown in FIG. 1 uses the controlled fabrication of an array of GaN nanowires with uniform heights and adequate n=type conductivity within the small dimensions of the nanowire, followed by the radial sidewall growth of the InGaN/GaN MQWs and subsequent lateral growth of a p-(In)GaN layer which coalesces and connects all the nanowires at the top of the structure to create a continuous film (canopy) for the p-type contact. This requires control of the growth in all three dimensions (along different crystallographic directions) for layers of different composition and grown at different temperatures, which are both factors that influence facet-dependent growth rates. A periodic spacing of the nanowires (e.g., a hexagonal or rectangular lattice) is also preferred in order to assure good LED growth uniformity and current injection uniformity, both of which would be detrimentally impacted by randomly assembled nanowires. The process is scalable to wafer-sized areas to enable a manufacturable product.

Figure 2:
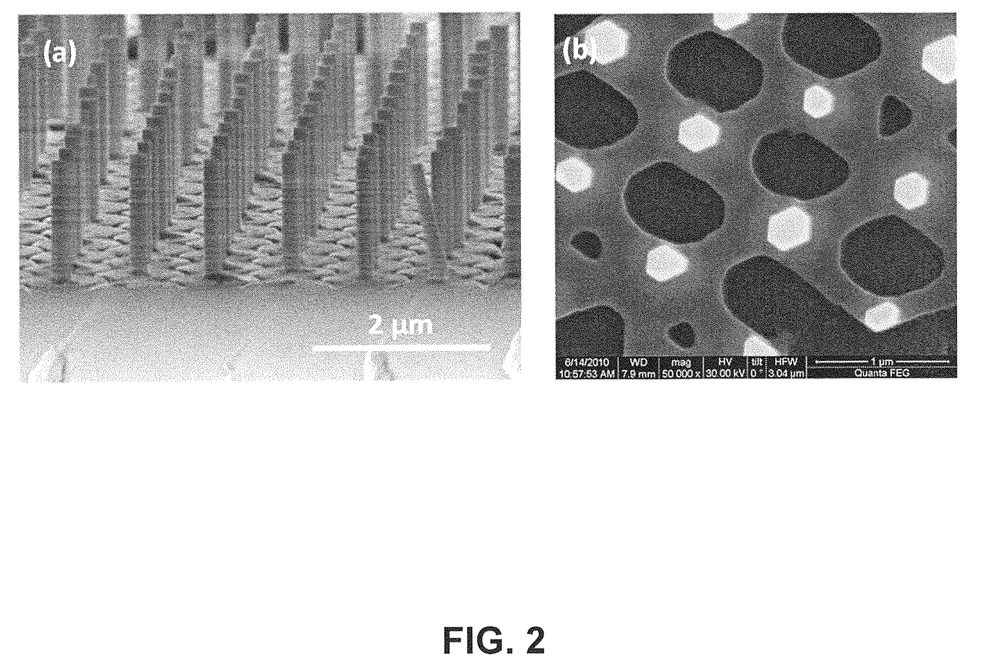
FIG. 2(a) is a side view SEM image and FIG. 2(b) is a plan view SEM image showing top-down etched n-type GaN nanowires with uniform heights.

The exemplary n-type GaN nanowire template 14 can be created using the top-down fabrication process which begins with growing a ~4-5 μm thick GaN template layer 12 on c-plane sapphire 11 by MOCVD in a Veeco D125 short-jar reactor using a two-step approach and a delayed-recovery technique. See S. Nakamura, *Jpn. J. Applied Phys.* 30, L1705 (1991); and D. D. Koleske et al., *Appl. Phys. Lett.* 81, 1940 (2002). The GaN templates have typical threading dislocation densities (TDDs) in the mid $10^8$ cm$^{-2}$ range. Next, the template is covered with a masking layer consisting of a hexagonally close-packed monolayer of self-assembled monodisperse colloidal silica spheres formed in a Langmuir-Blodgett trough, and then is subject to a Cl-based inductively coupled plasma (ICP) etch forming the periodic array of vertically aligned nanowires. See Q. Li et al., *Appl. Phys. Lett.* 94, 231105 (2009). The resulting nanowires are tapered and have an average pitch determined by the diameter of the colloidal silica spheres (typically 0.3-1.0 μm), and are uniform in height. The colloidal silica hexagonal closed-pack mask can produce arrays of nanowires with long-range order over areas that are typically several tens of microns. Defects are typically limited to slips in the hexagonal ordering. Such slip defects are not a problem because spacing between nanowires across the slip is not significantly different from the ordered areas, and the p-(In)GaN layer thickness is chosen so that such areas can still be adequately covered. The nanowires are then subject to an anisotropic KOH-based (AZ400K photoresist developer) wet etch that removes surface damage from the ICP etch and forms hexagonally-faceted nanowires 14 with straight sidewalls and controllable diameters, as shown in FIGS. 2(*a*) and 2(*b*). Due to the fast wet etch rate along the [10$^{-1}$0] and equivalent directions and negligible etch rate at the Ga polar (0001) top facet, the resultant nanowire is hexagonally faceted with straight {10-10} m-plane sidewalls and a (0001) c-plane nanowire top facet. This "top-down" fabrication technique of the GaN nanowires has several advantages including: all the nanowires have the same height, subsequent growth is on well-defined crystal facets, and dry etch damage is removed. For a typical starting film with TDD ~5×$10^8$ cm$^{-2}$ only ~6 percent of the nanowires contain threading dislocations when etched to around 150 nm in diameter, providing a high quality template for nanowire LED growth.

Following the top-down fabrication of the ordered n-type GaN nanowire array 14, the rest of the LED structure is grown radially around the nanowires. A typical structure includes the growth of a shell layer 15 comprising an n-type GaN layer and InGaN underlayer, a set of InGaN/GaN MQW active layers, and an undoped GaN layer and/or AlGaN electron blocking layer. During the growth of these layers the formation of new semipolar top facets 17, {10-11}, occurs at the nanowire tip and base, resulting in the extinction of the top c-plane facet and creating a pointed apex to the nanowires. Similarly, a InGaN/GaN layer 13 will grow on the base n-GaN unetched template layer 12 during the growth of the shell layer 15 on the vertically aligned n-GaN nanowires 14. The hybrid nanowire-film LED structure is completed by growth of a p-type InGaN or p-type GaN canopy layer 16 that forms a coalesced film that connects the tops of all the nanowires, which importantly allows for standard planar device processing.

Figure 3:
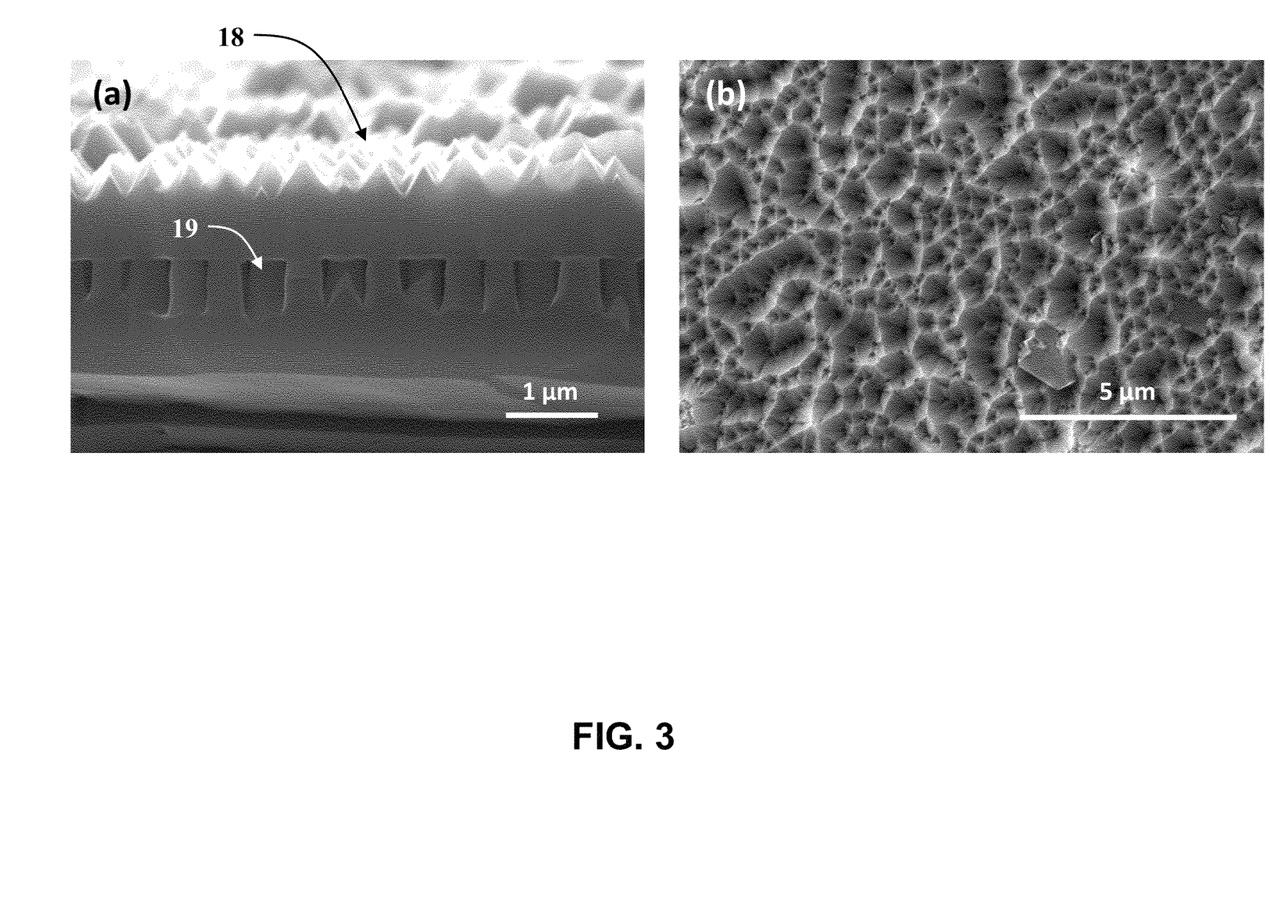
FIG. 3(a) is a cross-sectional view and FIG. 3(b) is a plan view SEM images of the completed hybrid core-shell nanowire-film structure.

FIG. 3(*a*) shows a cross-sectional SEM image of a completed hybrid nanowire-planar LED structure employing an array of n-GaN nanowires with 500 nm pitch and ~1 μm height, an initial ~80 nm thick n-type GaN layer, a 15 nm thick $In_{0.015}Ga_{0.985}N$ layer, an eight period InGaN/GaN MQW structure, and a p-InGaN coalesced layer. The p-InGaN layer grows on all sides of the nanowires and eventually coalesces creating a continuous canopy film at the top of the structure. The top surface 18 is faceted with {10-11} planes, and embedded air voids 19 are left at the bottom between nanowires which enhances light extraction. See C. Y. Cho et al., *Opt. Express* 19, A943 (2011); W. C. Lai et al., *Appl. Phys. Lett.* 97, (2010); and K. Hyung Gu et al., *Appl. Phys. Lett.* 95, 221110 (2009). A top view of the completed structure is shown in FIG. 3(*b*). This naturally faceted surface can enhance light extraction from the device without the need for intentional roughening of the surface.

Figure 4:
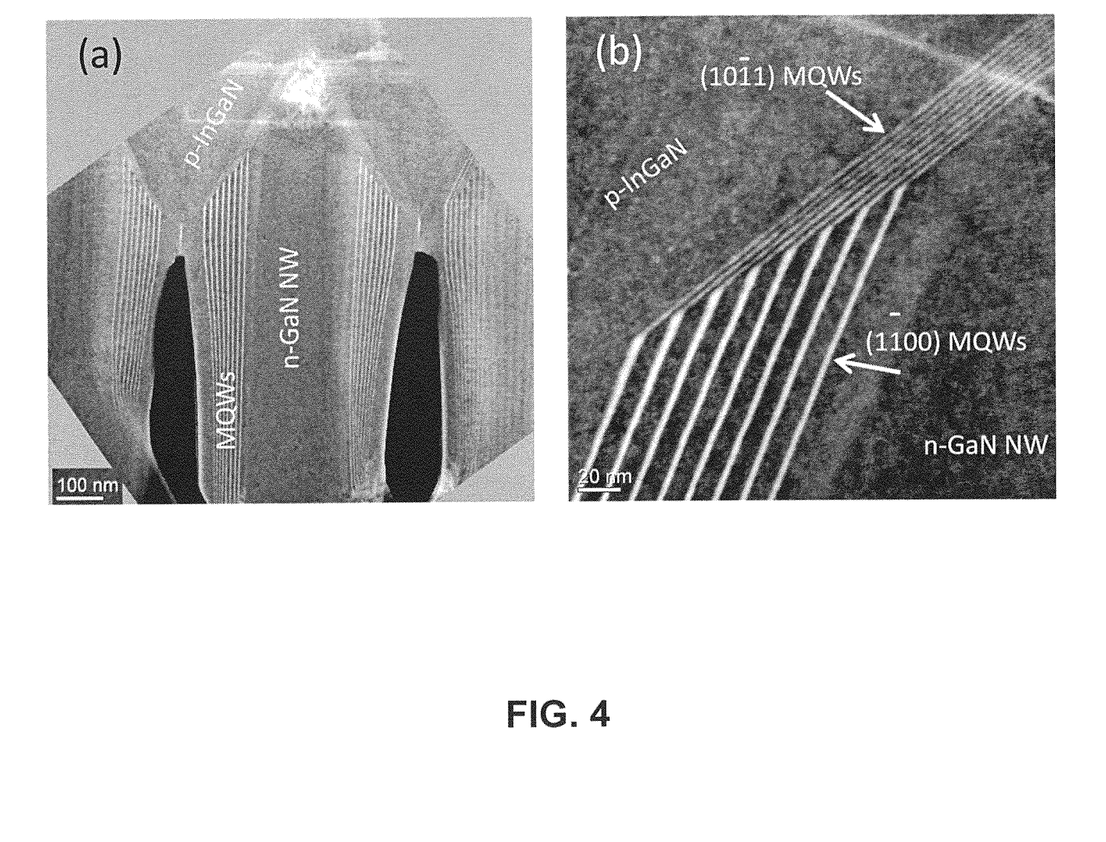
FIGS. 4(a) and 4(b) are cross-section STEM images showing completed hybrid core-shell nanowire-film structure.

The nanowire LED structure was further elucidated by cross-sectional scanning transmission electron microscopy (STEM) and energy dispersive x-ray spectroscopy (EDS). The STEM sample was prepared by focused ion beam milling. The cross-sectional STEM image in FIG. 4(*a*) shows that following LED growth, the nanowires have a diameter of ~400 nm, half-way up the height of the nanowire, leaving ~100 nm spaces between nanowires. The MQW growth on the m-plane sidewalls is faster than on the semipolar planes, resulting in thinner InGaN/GaN quantum wells on the semipolar facts compared to the m-plane surfaces (1.5 nm/1.5 nm compared to 2.5/9 nm), as seen in the close-up image in FIG. 4(*b*). EDS analysis revealed that the indium incorporation is different on the two facets with x~0.33 on the m-plane compared to x~0.22 on the semipolar facets. The high indium concentration of the InGaN wells on the m-facets without evidence of segregation is significant. Tellingly, a planar GaN control sample grown along with the nanowire templated sample resulted in an optically-black color, compared to the clear color of the nanowire sample, indicating metallic indium incorporated at some step during growth. This result suggests that the nanowire structure is indeed able to incorporate more indium than planar structures and remain stable due to strain accommodation. Importantly, the p-InGaN layer is also seen to extend down along the nanowire sidewalls (~30-40 nm thickness), allowing for the injection of holes into the nanowire m-plane sidewall MQW layers.

Figure 5:
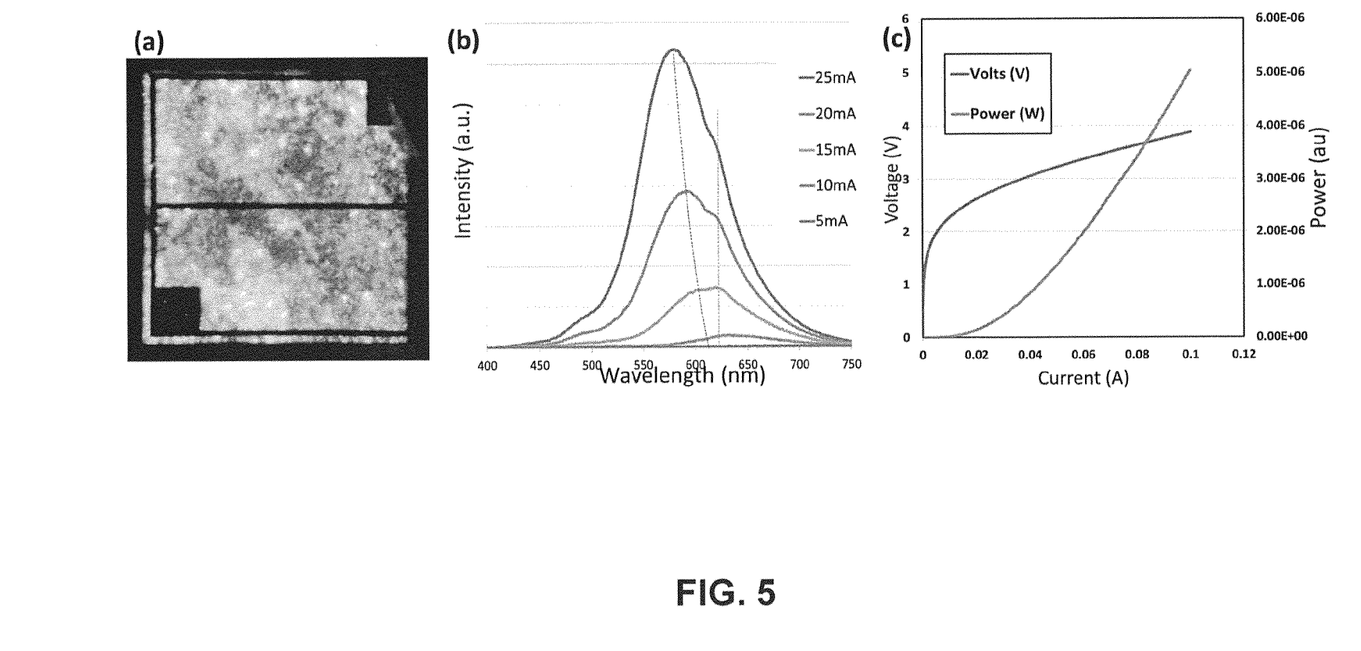
FIG. 5(a) is an optical image of yellow electroluminescence from a nanowire LED.
FIG. 5(b) is a nanowire LED emission spectra vs. current.
FIG. 5(c) is a graph of nanowire LED I-V characteristics.

Electroluminescence from this hybrid nanowire LED structure was demonstrated. Ni/Au (150A/150A) contacts were made to the p-InGaN canopy layer. For the n-type contact, the periphery of the device was ICP etched to the n-type layer and an Al contact was made to the bottom n-type layer. The LED device size was 250 μm×250 μm and light was collected through the top p-InGaN surface. FIG. 5(*a*) shows an optical image of the yellow electroluminescence from the nanowire LED. FIG. 5(*b*) shows the spectral response of the LED under electrical injection. FIG. 5(*c*) shows the I-V characteristics of the nanowire LED. Significantly it is seen that, under electrical injection, this LED emits at the longer yellow-red wavelengths. Interestingly, two primary emission peaks are observed: one which blue shifts from ~600 nm at 15 mA to ~565 nm at 30 mA, and another at ~615 nm which is stable with respect to injection current. Based on structural and compositional analysis, the current-stable 615 nm emission is believed to originate from the m-plane MQWs which show higher indium concentration (x~0.33) vs. the semipolar facets (x~0.22); the lack of wavelength shift with increasing injection current is also consistent with the nonpolar m-plane orientation of the MQWs. The other peak that blue-shifts with injection current likely originates from the semipolar MQWs.

The formation of the semipolar planes can be eliminated during growth. Additionally, emission from indium-rich InGaN clusters near the nanowire tip cannot be ruled out.

Figure 6:
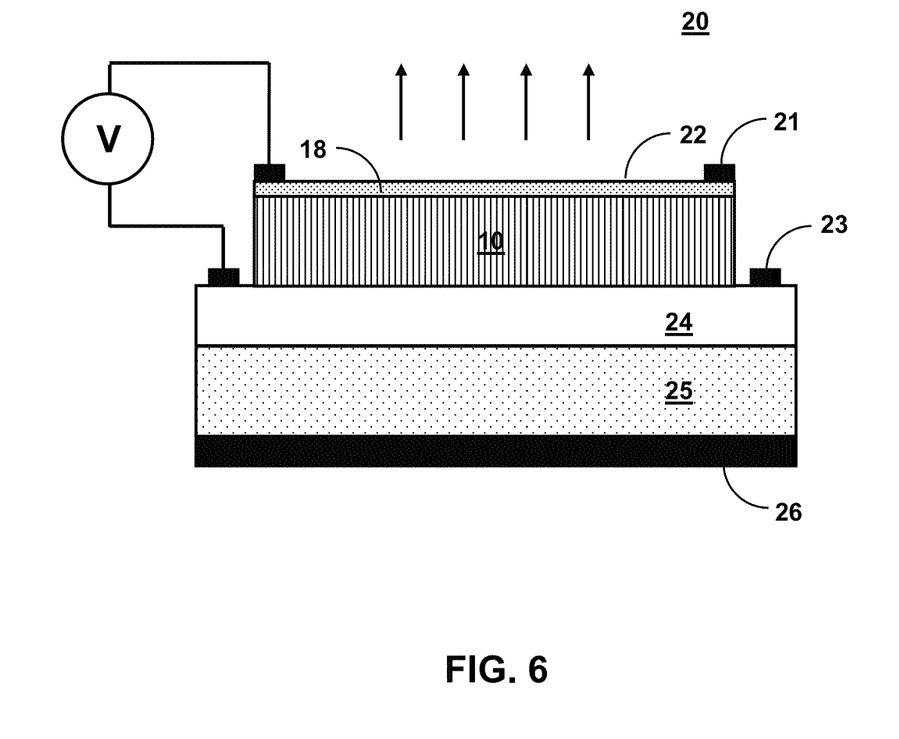
FIG. 6 is a cross-sectional view schematic illustration of an amber LED comprising a Group III-Nitride nanowire active region.

FIG. 6 shows a cross-sectional side view schematic illustration of a fully processed LED device 20. The LED device 20 is a standard top-emitting structure. A p-contact 21 can be connected to a spreading metal contact 22 that can be used to overcome the resistance and poor current spreading in the underlying p-type (In)GaN canopy layer of the core-shell structure 10. A simple Ni/Au contact can be used. Alternatively, an indium-tin-oxide (ITO) p-type contact can be used. Such contacts are used on planar p-GaN for III-nitride LEDs. See S. Watanabe et al., *Appl. Phys. Lett.* 83, 4906 (2003). P-type layer doping and deposition conditions on the faceted surfaces 18 can be optimized to ensure ohmic contacts (measured by transmission line model (TLM) structures) and also the proper thickness to spread the current effectively. Switching from Ni/Au to ITO contacts can reduce the absorption and increase the extraction efficiency. Etching beyond the nanowires to the underlying n-GaN layer 24 can form a mesa and for contacting to the n-type layers of the core-shell structure 10. Finger contacts can be used for the Al-based n-contacts 23 to ensure effective current spreading on the n-side of the device and minimize resistance. To complete the device fabrication the backside of the sapphire substrate 25 can be lapped and polished, and then an Al reflector 26 topped with solderable metals can be deposited on the polished back surface. When a voltage is applied across the p- and n-contacts, electroluminescent light is emitted from the multiple quantum well core-shell structure 10 and extracted through the top surface of the device 20. Simple light-out, I-V, and spectral measurements can be performed on the wafer to find acceptable LED devices. The devices can be packaged by first dicing them out from the wafer, solder attaching them to TO-8 headers, and wire-bonding so that they can be tested. Encapsulation using silicones and other packaging means can be used to ensure maximum light extraction.

The present invention has been described as an amber light-emitting diode comprising a Group III-Nitride nanowire active region. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A light-emitting diode, comprising:
   a substrate having a frontside and a backside;
   an n-type base grown on the frontside of the substrate;
   a core-shell structure on the n-type base, comprising an array of vertically aligned faceted n-type nanowire cores, each core surrounded by a radially grown Group III-nitride multiple quantum well shell layer providing a core-shell nanowire;
   a p-type canopy layer grown on all crystal facets of the core-shell nanowires, and that is coalesced at the top providing a continuous top surface, wherein the top surface of the canopy layer is faceted on a plurality of crystal planes of the nanowire cores, thereby providing a continuous film that electrically connects the tops and sides of all the nanowires, further providing a void between adjacent n-type nanowire cores and between the continuous top surface and the n-type base; and
   a p-contact to the p-type canopy layer and an n-contact to the n-type base for applying a voltage across the core-shell structure and extracting electroluminescent emitted light therefrom.

2. The light-emitting diode of claim 1, wherein the n-type nanowire cores comprise n-type GaN, the shell layer comprises an InGaN/GaN multiple quantum well, and the p-type canopy layer comprises p-type InGaN or p-type GaN.

3. The light-emitting diode of claim 2, wherein the indium concentration of the InGaN layers of the multiple quantum well is greater than 20%.

4. The light-emitting diode of claim 1, wherein the emitted light has a wavelength of between 550 nm and 620 nm.

5. The light-emitting diode of claim 1, wherein the p-contact comprises Ni/Au, a transparent conductive oxide, or Ag.

6. The light-emitting diode of claim 1, wherein the n-contact comprises Al or Ti/Au.

7. The light-emitting diode of claim 1, wherein the substrate is transparent to the emitted light.

8. The light-emitting diode of claim 7, wherein the substrate comprises sapphire, silicon, GaN, SiC, or AlN.

9. The light-emitting diode of claim 7, further comprising a reflective layer deposited on the backside of the substrate.

10. The light-emitting diode of claim 9, wherein the reflective layer comprises aluminum or silver.

11. The light-emitting diode of claim 1, further comprising a spreading metal contact layer on the p-type canopy layer.

12. The light-emitting diode of claim 1, further comprising an indium-tin-oxide layer on the p-type canopy layer.

13. The light-emitting diode of claim 2, further comprising an InGaN underlayer between the n-type nanowire core and the InGaN/GaN multiple quantum well shell layer.

14. The light-emitting diode of claim 2, further comprising an AlGaN electron blocking layer between the InGaN/GaN multiple quantum well shell layer and the p-type canopy layer.

15. The light-emitting diode of claim 1, wherein the height of the nanowire cores is less than 10 microns.

16. The light-emitting diode of claim 1, wherein the diameter of the nanowire cores is less than 1 micron.

17. The light-emitting diode of claim 1, wherein the array comprises a hexagonal or rectangular lattice.

\* \* \* \* \*